(12) United States Patent
Sekine et al.

(10) Patent No.: US 7,746,138 B2
(45) Date of Patent: Jun. 29, 2010

(54) SEMICONDUCTOR INTEGRATED CIRCUIT WITH FLIP-FLOP CIRCUITS MOUNTED THEREON

(75) Inventors: Satoru Sekine, Anpachi-Gun (JP); Yoshitaka Ueda, Ogaki (JP); Takashi Asano, Anpachi-Gun (JP); Shinji Furuichi, Maibara (JP); Atsushi Wada, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 12 days.

(21) Appl. No.: 12/044,406

(22) Filed: Mar. 7, 2008

(65) Prior Publication Data

US 2008/0218235 A1 Sep. 11, 2008

(30) Foreign Application Priority Data

Mar. 7, 2007 (JP) ............................. 2007-057511

(51) Int. Cl.
*H03K 3/00* (2006.01)
(52) U.S. Cl. ....................................... 327/200; 327/218
(58) Field of Classification Search ................. 327/199, 327/200, 218, 272, 293, 295
See application file for complete search history.

(56) References Cited

U.S. PATENT DOCUMENTS 6,621,306 B2 * 9/2003 Ooishi et al. ................ 326/119

| | | | |
|---|---|---|---|
| 7,443,218 B2 * | 10/2008 | Onouchi et al. | 327/218 |
| 2002/0005745 A1 * | 1/2002 | Robertson et al. | 327/218 |
| 2004/0088659 A1 * | 5/2004 | Mori | 716/2 |

FOREIGN PATENT DOCUMENTS

JP 05-054100 A 5/1993

* cited by examiner

*Primary Examiner*—Lincoln Donovan
*Assistant Examiner*—Ryan C Jager
(74) *Attorney, Agent, or Firm*—Ditthavong, Mori & Steiner, P.C.

(57) ABSTRACT

A plurality of flip-flop circuits, having different circuit configurations, which perform an identical digital signal processing are mixed on a single semiconductor substrate. A first flip-flop circuit among the plurality of flip-flop circuits receives a clock signal supplied from outside the flip-flop circuits, through at least two stage inverters, and operates with clock signals outputted from the inverters. A second flip-flop circuit receives the clock signal supplied from outside the flip-flop circuits through at least one inverter having a less number of stages than the number of stages of the inverter contained in the first flip-flop circuit, and operates with at least one of the clock signal and a clock signal outputted from the inverter.

3 Claims, 4 Drawing Sheets

SEMICONDUCTOR INTEGRATED CIRCUIT WITH FLIP-FLOP CIRCUITS MOUNTED THEREON

CROSS-REFERENCE TO A RELATED APPLICATION

This application is based upon and claims the benefit of priority from the prior Japanese Patent Application No. 2007-057511, filed on Mar. 7, 2007, the entire contents of which are incorporated herein by reference.

BACKGROUND OF THE INVENTION

1. Field of the Invention

The present invention relates to a semiconductor integrated circuit that mounts flip-flop circuits thereon.

2. Description of the Related Art

Various digital equipment, such as digital television sets or digital audio players, has been in widespread use and the demand for LSIs (Large Scale Integration) used for digital signal processing has been ever increasing. A great number of flip-flop circuits are mounted on such LSIs, as fundamental components for sequential circuits.

While energy conservation is being promoted, the reduction in power consumption of LSIs has been long called for. From the viewpoint of extending battery life, the reduction in power consumption is also required for LSIs mounted on battery-powered equipment represented by mobile equipment.

In order to reduce the power consumed by LSIs, various methods, such as reducing a gate size of transistors, have been proposed. However, when such methods are applied to the flip-flop circuits, there are cases where a clock signal or data signal inputted to the flip-flop circuit becomes unsharp or noise like glitch occurs. Such phenomena may cause malfunctions in the flip-flop circuits.

As described above, the power consumption of LSIs and the stability of circuit operation is in a trade-off relation. This is because the circuit operation becomes unstable in trying to reduce the power consumption, whereas it is more difficult to reduce the power consumption as the reliability of circuit operation is raised.

SUMMARY OF THE INVENTION

A semiconductor integrated circuit according to one embodiment of the present invention includes a plurality of flip-flop circuits, having different circuit configurations, which perform an identical digital signal processing. The plurality of flip-flop circuits are mixed on a single semiconductor substrate.

BRIEF DESCRIPTION OF THE DRAWINGS

Embodiments will now be described by way of examples only, with reference to the accompanying drawings which are meant to be exemplary, not limiting, and wherein like elements are numbered alike in several Figures in which.

DETAILED DESCRIPTION OF THE INVENTION

Figure 1:
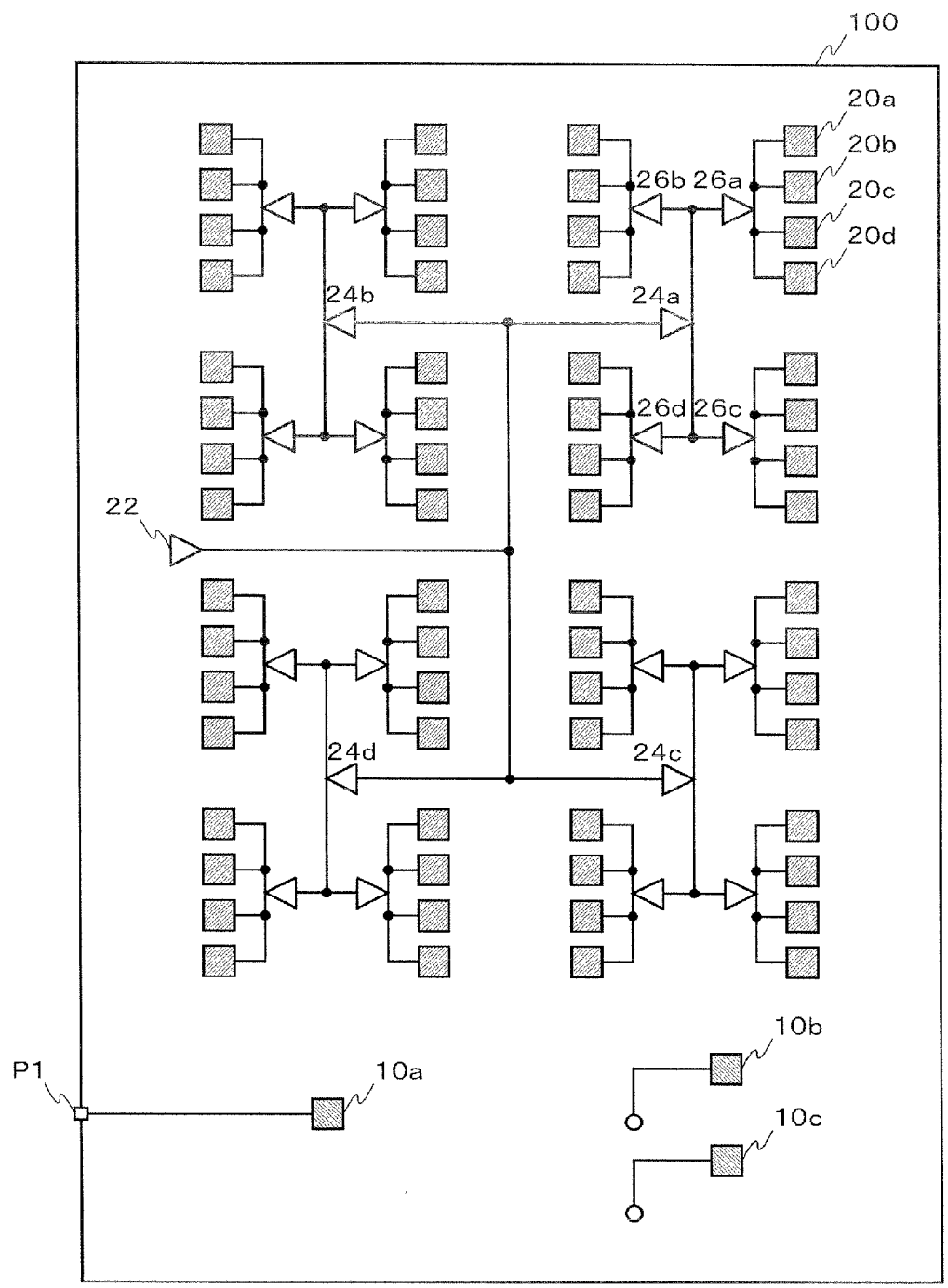
FIG. 1 schematically illustrates a structure of a semiconductor integrated circuit according to an embodiment of the present invention.

The invention will now be described by reference to the preferred embodiments. This does not intend to limit the scope of the present invention, but to exemplify the invention.

A description of a typical embodiment will be given before a detailed description of embodiments of the present invention. A semiconductor integrated circuit according to one embodiment of the present invention includes a plurality of flip-flop circuits, having different circuit configurations, which perform an identical digital signal processing. The plurality of flip-flop circuits are mixed on a single semiconductor substrate.

According to this embodiment, a plurality of flip-flop circuits, having different circuit configurations, which perform the same digital signal processing, are used separately for different purposes. Thus, the demand for the reduction in power consumption and the demand for stable operation can both be achieved.

The plurality of flip-flop circuits may circuit include a first flip-flop circuit and a second flip-flop circuit; the first flip-flop circuit may include a first buffer configured by a plurality of inverters; the second flip-flop circuit may include a second buffer configured by at least one inverter which has the number of stages smaller than that of the first flip-flop circuit; the first buffer may receive a first input clock signal supplied from outside the flip-flop circuits so as to be supplied to the first flip-flop circuit; and the second buffer may receive a second input clock signal supplied from outside the flip-flop circuits so as to be supplied to the second flip-flop circuit. "The number of stages smaller than that of the first flip-flop circuit" may contain "zero" stage. That is, the second flip-flop circuit may operate in a mode where the clock signal supplied from the outside is directly used.

The plurality of flip-flop circuits may include: a first flip-flop circuit including a plurality of clocked inverters; and a second flip-flop circuit including at least one clocked inverter the number of which is less than the number of clocked inverters included in the first flip-flop circuit.

The plurality of flip-flop circuits may include: a first flip-flop circuit including a first transistor in which conduction or nonconduction is controlled by a clock signal; and a second flip-flop circuit including a second transistor in which conduction or nonconduction is controlled by the clock signal. The size of the first transistor may be set smaller than the size of the second transistor.

According these embodiments, the second flip-flop circuit can be designed to consume less power than the first flip-flop circuit does.

A semiconductor integrated circuit may be configured by including a plurality of the second flip-flop circuits, wherein an external clock signal, supplied externally, with an equal delay time assured may be inputted to each of the plurality of the second flip-flop circuits. The external clock signal may be supplied via a path wired by a clock tree scheme. As a result, the operational stability of the second flip-flop circuit can be enhanced and a reduced operation stability can be offset by a circuit configuration.

Arbitrary combinations of the aforementioned constituting elements, and the implementation of the present invention in the form of a method, an apparatus and so forth may also be effective as and encompassed by the embodiments of the present invention.

With reference to the Figures, the invention will now be described based on the following preferred embodiments. The same or equivalent components, members and processings shown in Figures are given the identical reference numerals and the repeated description thereof will be omitted as appropriate. The following preferred embodiments do not intend to limit the scope of the present invention but exemplify the invention, and all of the features and the combinations thereof described in the embodiments are not necessarily essential to the invention.

FIG. 1 schematically illustrates a structure of a semiconductor integrated circuit 100 according to an embodiment of the present invention. Two kinds of flip-flop circuits are mounted on a semiconductor integrated circuit 100 according to the presents embodiment.

A flip-flop circuit 10 receives the supply of a clock signal CLK via a pad P1 from an external clock generation circuit and is operated therewith. Alternatively, the flip-flop circuit 10 receives the supply of a clock signal CLK from a clock generation circuit mounted within the semiconductor integrated circuit 100 and is operated therewith. In FIG. 1, a first flip-flop circuit 10a receives the supply of a clock signal CLK from an external source. First flip-flop circuit 10b and 10c receive the supply of a clock signal CLK from within. The number of first flip-flop circuits 10 may be arbitrarily set and designed by a designer. The first flip-flop circuits 10 may receive the supply of the clock signal CLK from either an external source only or within the semiconductor integrated circuit 10 only.

A second flip-flop circuit 20 receives the supply of a clock signal CLK from an H-tree wiring and is operated therewith. An H-tree scheme is a scheme where an H-shaped wiring path is provided repeatedly in a manner that it is proportionally reduced recursively. Because of the symmetrical property thereof, an equal wiring length and an equal delay time of the clock signal CLK can be assured.

A root driver cell 22 receives the supply the clock signal CLK from an internal clock generation circuit of the semiconductor integrated circuit 100 or an external clock generation circuit, and then supplies it to a plurality of first-hierarchy buffer cells 24 in parallel therewith. In FIG. 1, the clock signals are supplied, in parallel, to four first-hierarchy buffer cells 24a to 24d. Each of the first-hierarchy buffer cells 24a to 24d supplies the clock signal CLK supplied from the root driver cell 22, to four second-hierarchy buffer cells 26a to 26d in parallel therewith. Each of the second-hierarchy buffer cells 26a to 26d supplies the clock signal CLK supplied from the first-hierarchy buffer cells 24a to 24d, to four second flip-flop circuits 20a to 20d in parallel therewith.

Note that the number of hierarchies in the buffer cell and the number of buffers in the same hierarchies may be set arbitrarily by a designer. Also, the number of second flip-flop circuits 20 that receive the supply of the clock signal CLK from each of the second hierarchy buffer cells 26a to 26d may be set arbitrarily by the designer. Thus, it is possible to have a configuration where a single second flip-flop circuit 20 receives the supply of the clock signal CLK from each of the second hierarchy buffer cells 26a to 26d.

The first flip-flop circuits 10 and the second flip-flop circuits 20 have the same functions as logic circuits for performing digital signal processings. One of differences between them lies in a method for supplying the clock signal CLK. Since a plurality of second flip-flop circuits 20 receive the supply of the clock signals CLK in parallel via a clock signal line wired in an H-tree shape, the synchronization of the respective clock signals CLK is guaranteed. In contrast thereto, since a plurality of first flip-flop circuits 10 receive the supply of the respective clock signals CLK directly from an external or internal clock generation circuit, the synchronization of the respective clock signals CLK is not guaranteed.

A difference in circuit configuration between the first flip-flop circuit 10 and the second flip-flop circuit 20 is now described. A description is first given of a first embodiment. In the first embodiment, the structure of a clock buffer, which stores temporarily the clock signal CLK supplied externally or inverts a clock signal, differs between the first flip-flop circuit 10 and the second flip-flop circuit 20.

Figure 2:
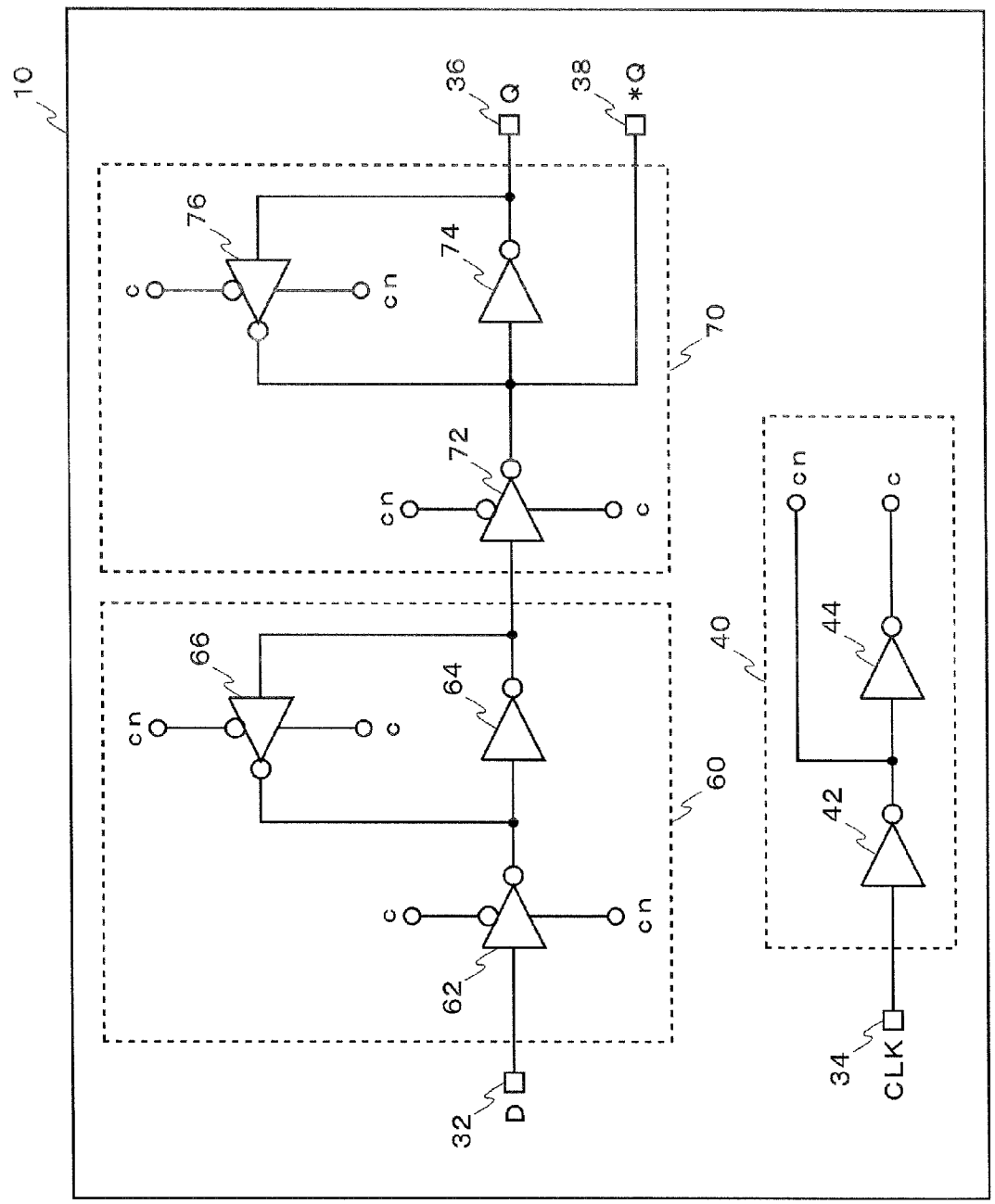
FIG. 2 is a circuit diagram showing a configuration of a first flip-flop circuit according to a first embodiment of the present invention.

FIG. 2 is a circuit diagram showing a configuration of the first flip-flop circuit 10 according to the first embodiment. As input/output terminals, the first flip-flop circuit 10 includes a data input terminal 32 to which input data D are inputted, a clock input terminal 34 to which a clock signal CLK is inputted, a noninverting output terminal 36 from which an output signal Q is outputted, and an inverting output terminal 38 from which an inverted output signal *Q is outputted. In the present embodiment, the inversion of a given logic signal, namely the complementary level thereof, is denoted by "*". This first flip-flop circuit 10 latches the input data D based on the clock signal CLK so as to output the output signal Q and the inverted output signal *Q.

The first flip-flop circuit 10 includes a first clock buffer 40, a master latch circuit 60, and a slave latch circuit 70. The first clock buffer 40 includes a first clocked inverter 42 and a second clocked inverter 44. The first clocked inverter 42 and the second clocked inverter 44 are connected in series with each other. The first clocked inverter 42 inverts the clock signal CLK supplied externally via the clock input terminal 34 so as to generate an inverted clock signal cn. The second clocked inverter 44 inverts the inverted clock signal outputted from the first clocked inverter 42 so as to generate a clock signal c.

The master latch circuit 60 includes a first master-side clocked inverter 62, a master-side inverter 64, and a second master-side clocked inverter 66. The clocked inverter operates responsive to the receipt of a clock signal and an inverted clock signal. When the signal inputted to the noninverting clock terminal is in a high level, the clocked inverter may be thought simply as an inverter, and inverts the input signal and outputs the inverted signal. On the other hand, when the signal inputted to the noninverting clock terminal is in a low level, the output terminal is in a high impedance state regardless of the state of the input signal. In this period, the clocked inverter functions as the switch to separate the input and the output electrically.

The inverted clock signal cn is inputted to the noninverting clock terminal of the first master-side clocked inverter 62, whereas the clock signal c is inputted to the inverting clock terminal thereof. While the clock signal c goes high, the first master-side clocked inverter 62 is inactivated, so that the input data D is not reflected in the output. However, while the clock signal c goes low, the first master-side clocked inverter 62 is activated and thus inverts the input data D so as to output the inverted data to the master-side inverter 64.

The master-side inverter 64 inverts the inputted data and outputs the thus inverted data to the second master-side clocked inverter 66 and a first slave-side clocked inverter 72 described later, in parallel with each other. While the clock signal c goes low, the data are inputted from the first master-side clocked inverter 62 to the master-side inverter 64, whereas while the clock signal c goes high, the data are inputted from the second master-side clocked inverter 66 to the master-side inverter 64.

The clock signal c is inputted to the noninverting clock terminal of the second master-side clocked inverter 66, whereas the inverted clock signal cn is inputted to the inverting clock terminal thereof. While clock signal c goes low, the second master-side clocked inverter 66 is inactivated, so that the output data of the master-side inverter 64 is not reflected in the output. However, while the clock signal c goes high, the second master-side clocked inverter 66 is activated and thus inverts the input data so as to output the inverted data to the master-side inverter 64. In this manner, the activation period and the inactivation period in the first master-side clocked inverter 62 is set opposite to those of the second maser-side clocked inverter 66.

The slave latch circuit 70 includes a first slave-side clocked inverter 72, a slave-side inverter 74, and a second slave-side clocked inverter 76. A clock signal c is inputted to the noninverting clock terminal of the first slave-side clocked inverter 72, whereas an inverted clock signal cn is inputted to the inverting clock terminal thereof. While the clock signal c goes low, the first slave-side clocked inverter 72 is inactivated, so that the output data of the master-side inverter 64 is not reflected in the output. However, while the clock signal c goes high, the first slave-side clocked inverter 72 is activated and thus inverts the output data of the master-side inverter 64 so as to output the inverted data to the inverting output terminal 38 and the slave-side inverter 74 in parallel with each other.

The slave-side inverter 74 inverts the inputted data and outputs the thus inverted data to the noninverting output terminal 36 and the second slave-side clocked inverter 76 in parallel with each other. While the clock signal c goes high, the data are inputted from the first slave-side clocked inverter 72 to the slave-side inverter 74, whereas while the clock signal c goes low, the data are inputted from the second slave-side clocked inverter 76 to the slave-side inverter 74.

An inverted clock signal on is inputted to the noninverting clock terminal of the second slave-side clocked inverter 76, whereas a clock signal c is inputted to the inverting clock terminal thereof. While the clock signal c goes high, the second slave-side clocked inverter 76 is inactivated, so that the output data of the slave-side inverter 74 is not reflected in the output. However, while the clock signal c goes low, the second slave-side clocked inverter 76 is activated and thus inverts the input data so as to output the inverted data to the inverting output terminal 38 and the slave-side inverter 74 in parallel with each other.

In this manner, the activation period and the inactivation period in the first slave-side clocked inverter 72 is set opposite to those in the second slave-side clocked inverter 76. Also, the activation period and the inactivation period in the first master-side clocked inverter 62 is set opposite to those in the first slave-side clocked inverter 72. Also, the activation period and the inactivation period in the second master-side clocked inverter 66 is set opposite to those in the second slave-side clocked inverter 76. Thus, while the clock signal c goes low, the master latch circuit 60 takes in the input data D then outputs it to the slave latch circuit 70, whereas the slave latch circuit 70 latches the input data D which had been taken in one clock ago and outputted. While the clock signal c goes high, the master latch circuit 60 latches the input data D which had been taken in and outputted, whereas the slave latch circuit 70 takes in the input data D and outputs it.

Figure 3:
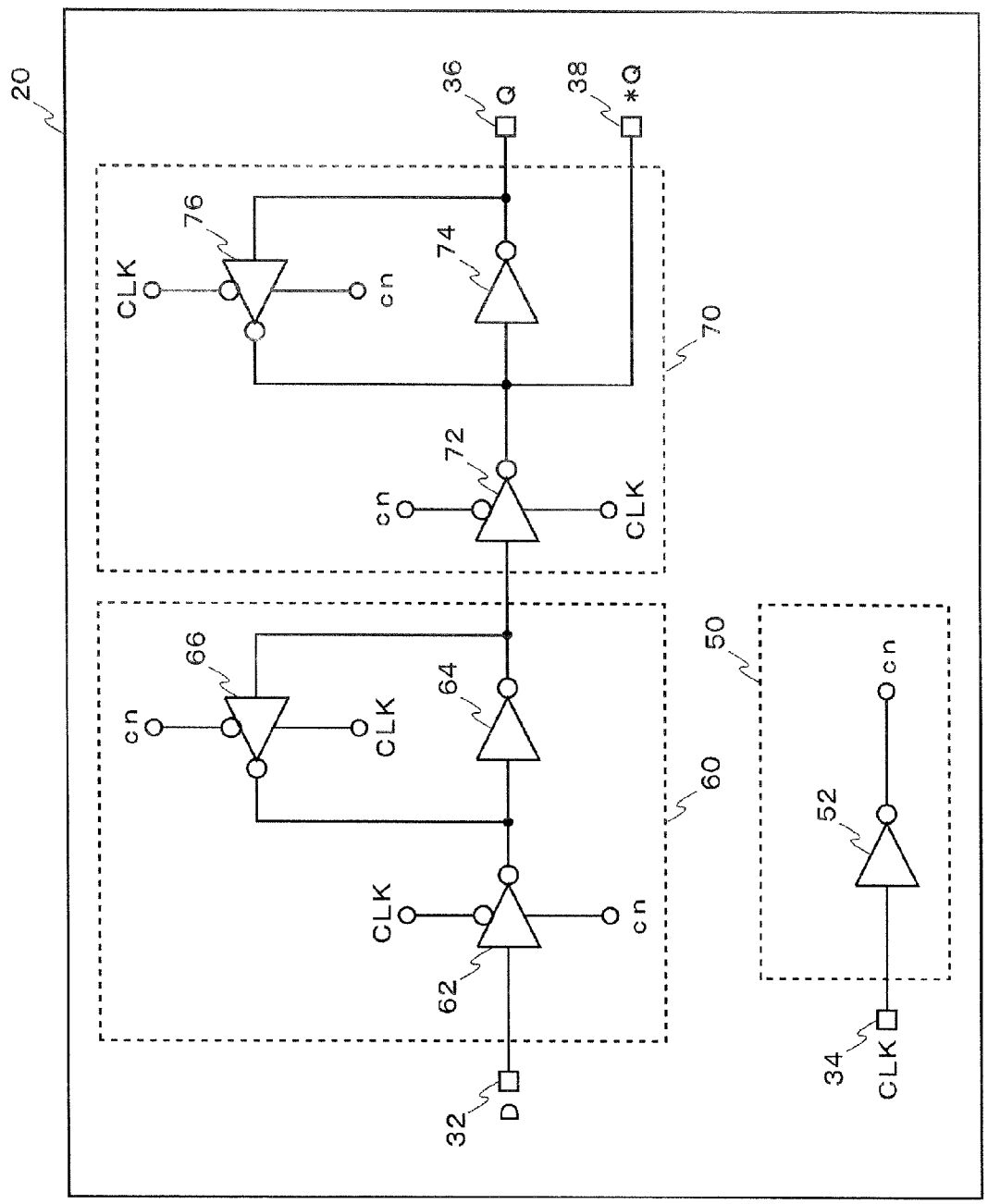
FIG. 3 is a circuit diagram showing a configuration of a second flip-flop circuit according to a first embodiment of the present invention.

FIG. 3 is a circuit diagram showing a configuration of a second flip-flop circuit 20 according to the first embodiment of the present invention. The second flip-flop circuit 20 has basically the same configuration as that of the first flip-flop circuit 10 shown in FIG. 2. Hereinbelow, differences are described. The second flip-flop circuit 20 is provided with a second clock buffer 50 in substitution for the first clock buffer 40. The second clock buffer 50 includes a third clock inverter 52. The third clock inverter 52 inverts a clock signal CLK supplied externally via the clock input terminal 34 so as to generate an inverted clock signal cn.

The clock signal CLK inputted from the outside is directly inputted to the inverting clock terminal of the first master-side clocked inverter 62, the noninverting clock terminal of the second master-side clocked inverter 66, the noninverting clock terminal of the first slave-side clocked inverter 72 and the inverting clock terminal of the second slave-side clocked inverter 76. The other configuration is the same as that of the first flip-flop circuit 10 shown in FIG. 2.

A comparison is made here between the first flip-flop circuit 10 shown in FIG. 2 and the second flip-flop circuit 20 shown in FIG. 3. The number of inverter stages for the second clock buffer 50 included in the second flip-flop circuit 20 is one, whereas the number of inverter stages for the first clock buffer 40 included in the first flip-flop circuit 10 is two. Thus, the power consumed by the second flip-flop circuit 20 is lower than the power consumed by the first flip-flop circuit 10. That is, it is difficult for the two transistors that constitute an inverter to operate ideally because a period occurs when both the transistors turn on and thereby a through current flows. Also, since the gate of a transistor has a capacitance, the increase in the number of inverter stages results in the increase in capacitance. Accordingly, as the number of inverter stages is smaller, the total amount of through current and the total amount of load capacity of the clock signal will decrease more, which in turn reduces the overall power consumption of circuitry. In particular, 20 to 45% of the power consumed by LSIs is consumed as a result of the transition of the clock signal. For this reason, reducing the power consumed by the transition of the clock signal proves effective in reducing the power consumed by LSIs.

In contrast, the circuit operation of the first flip-flop circuit 10 is more stabilized than that of the second flip-flop circuit 20. The second flip-flop circuit 20 directly uses the clock signals CLK supplied externally. Hence, the second flip-flop circuit 20 is liable to receive the effect of delay, attenuation or noise caused by the deficiency in performance of a buffer in a clock signal path or lengthened wires. Thereby, the following inconvenience may occur. That is, a time lag with respect to the inverted clock cn may increase because of an unsharp clock signal CLK. Or the transistors become deficient in performance because of a drop in amplitude of the clock signal CLK. Or malfunctions occur or operation speed drops because of the occurrence of noise like glitch. In contrast, the first flip-flop circuit 10 generates the clock signal c by the internal first clock buffer 40, so that the above problems are less likely to be encountered.

The second flip-flop circuit 20 operating with low power consumption and the first flip-flop circuit 10 whose circuit operation is stabilized are mixed on the semiconductor integrated circuit 100. Both the first flip-flop circuit 10 and the second flip-flop circuit 20 are logic circuits that achieve the same functions. The first flip-flop circuit 10 is used to achieve high accuracy or high-speed performance or it is used in locations where high accuracy or high-speed performance is required, or in locations where the suppression of unsharp clock signals or noise cannot be guaranteed. The second flip-flop circuit 20 is used in locations where high accuracy or high-speed performance is not required severely, or in locations where the suppression of unsharp clock signals or noise is guaranteed in the first place. Thus it is desirable that the second flip-flop circuit 20 be used in locations where clock signals can be supplied in the clock-tree scheme in which the unsharp clock signal or noise is less likely to occur, for instance. In order to achieve the supply of the clock signal wherein the deformation, such as unsharpness in edges, or noise is suppressed, a buffer cell for supplying the clock signals to a flip-flop circuit is arranged in the vicinity of the flip-flop circuit or is made to have a capacity to sufficiently suppress the deformation in clock signals and the like.

According to the first embodiment as described above, a plurality of flip-flop circuits, having different circuit configurations, which perform the identical function are integrated on a single semiconductor substrate and those flip-flop circuits are used separately for optimal purposes. As a result, a semiconductor integrated circuit stably operating with low power consumption can be achieved. The semiconductor integrated circuit that maximizes the performance by separately using a plurality of flip-flop 6 circuits for optimal purposes excels in general-purpose properties. Hence, the use of such a semiconductor integrated circuit makes the designing easier and shortens the designing period.

Next, a description is given of a second embodiment. The second embodiment differs from the first embodiment in the configuration of the slave latch circuit 70. That is, the second flip-flop circuit 20 includes an SRAM-type slave latch circuit.

Figure 4:
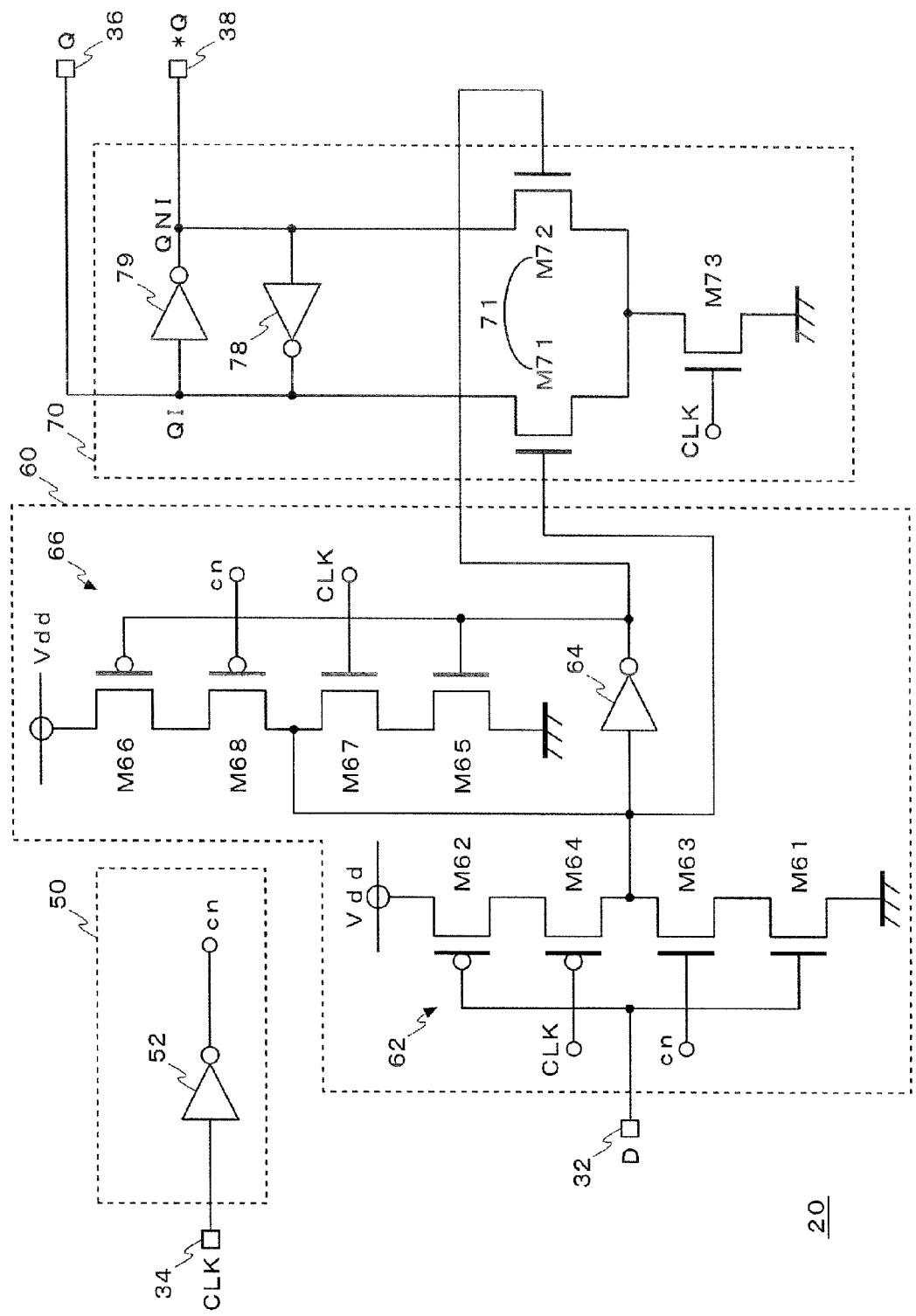
FIG. 4 is a circuit diagram showing a configuration of a second flip-flop circuit according to a second embodiment of the present invention.

FIG. 4 is a circuit diagram showing a configuration of a second flip-flop circuit 20 according to the second embodiment of the present invention. The second flip-flop circuit 20 according to the second embodiment includes a second clock buffer 50, a master latch circuit 60, and a slave latch circuit 70. The second clock buffer 50 has the same structure as that of the second clock buffer 50 according to the first embodiment.

The structure of the master latch circuit 60 is the same as that of the master latch circuit 60 according to the first embodiment. In the second embodiment, a first master-side clocked inverter 62 and a second master-side clocked inverter 66 are described more specifically.

The first master-side clocked inverter 62 includes a first input transistor M61, a second input transistor M62, a first control transistor M63, and a second control transistor M64. The first input transistor M61 is constituted by an N-channel MOSFET (Metal-Oxide-Semiconductor Field-Effect Transistor), whereas the second input transistor M62 is constituted by a P-channel MOSFET. The first input transistor M61 and the second input transistor M62 constitute a push-pull circuit wherein they are turned on and off, in a complementary manner, according to the input signal D. The first control transistor M63 and the second control transistor M64 are connected between the first input transistor M61 and the second input transistor M62. The first control transistor M63 is constituted by an N-channel MOSFET, whereas the second control transistor M64 is constituted by a P-channel MOSFET.

A first fixed potential (ground potential) is applied to a source terminal of the first input transistor M61, whereas the input data D is inputted to a gate terminal thereof. A drain terminal of the first input transistor M61 is connected to a source terminal of the first control transistor M63. A second fixed potential (power supply potential Vdd) is applied to a source terminal of the second input transistor M62, whereas the input data D is inputted to a gate terminal thereof. A drain terminal of the second input transistor M62 is connected to a source terminal of the second control transistor M64. The inverted clock signal cn is inputted to a gate terminal of the first control transistor M63. The clock signal CLK is inputted to a gate terminal of the second control transistor M64. A drain terminal of the first control transistor M63 and a drain terminal of the second control transistor M64 are connected together, and the potential of a connection point therebetween is output data.

A second master-side clocked inverter 66 includes a third input transistor M65, a fourth input transistor M66, a third control transistor M67, and a fourth control transistor M68. The relation of connection among the third input transistor M65, the fourth input transistor M66, the third control transistor M67 and the fourth control transistor M68 is the same as that among the first input transistor M61, the second input transistor M62, the first control transistor M63 and the second control transistor M64 and thus the description thereof is omitted here. Note that the clock signal CLK is inputted to a gate terminal of the third control transistor M67, whereas the inverted clock signal cn is inputted to a gate terminal of the fourth control transistor M68.

The slave latch circuit 70 includes a pair of transistors 71, an activation transistor M73, a first output inverter 78, and a second output inverter 79. The pair of transistors 71 is configured by including a fifth input transistor M71 and a sixth input transistor M72. The fifth input transistor M71 and the sixth input transistor M72 are connected in common with their sources. The fifth input transistor M71 and the sixth input transistor M72 are each constituted by an N-channel MOSFET.

The output data of a master-side inverter 64 is inputted to a gate terminal of the sixth input transistor M72, whereas data obtained after the input data D has been inverted by the first master-side clocked inverter 62 is inputted to a gate terminal of the fifth input transistor M71. In an active state, the fifth input transistor M71 and the sixth input transistor M72 are turned on and off, in a complementary manner, according to the input signal. A state where the pair of transistors 71 are activated is a state where, with the transistors being ON, a path leading from the second fixed potential (power supply potential Vdd) to the first fixed potential (ground potential) is capable of being electrically conducted.

A drain terminal of the fifth input transistor M71 and a drain terminal of the sixth input transistor M72, are connected with each other via the first output inverter 78 and the second output inverter 79 which are connected in opposite direction to each other. The first output inverter 78 and the second output inverter 79 function as memory for storing an internal signal QI and an inverted internal signal QNI at a complementary level.

The activation transistor M73 is provided between the pair of transistors 71 and the first fixed potential (ground potential). In a conduction state, the activation transistor M73 activates the pair of transistors 71. The activation transistor M73 is constituted by an N-channel MOSFET. A drain terminal of the activation transistor M73 is connected to the source terminals of the fifth input transistor M71 and the sixth input transistor M72 that constitute the pair of transistors 71, whereas a source terminal of the activation transistor M73 is grounded. A clock signal CLK is inputted to a gate terminal of the activation transistor M73.

The internal signal QI of the slave latch circuit 70 is outputted, from a noninverting output terminal 36, as an output signal Q. The inverted internal signal QNI of the slave latch circuit 70 is outputted, from an inverting output terminal 38, as an inverted output signal *Q.

Similar to the second flip-flop circuit 20 according to the first embodiment, while a clock signal CLK is in a low level, the master latch circuit 60 takes in the input data D and then outputs it to the slave latch circuit 70. And the slave latch circuit 70 latches the input data D which has been taken in and latched one clock ago and has already been outputted. While a clock signal CLK is in a high level, the master latch circuit 60 latches the input data which has been retrieve and outputted. And the slave latch circuit 70, which is activated by the conduction of the activation transistor M73, takes in an output of the master latch circuit 60 and latches it so as to be outputted.

The second flip-flop circuit 20 shown in FIG. 4 is now compared with the first flip-flop circuit 10 shown in FIG. 2. In the second flip-flop circuit 20, the structure of the slave latch circuit 70 is of an SRAM type. Thus the second flip-flop circuit 20 consumes less power. In comparison with a case when the clocked inverters are used, the number of transistors to which the clock signal is inputted can be reduced, so that the power consumed by the transition of the clock signal can be reduced.

In contrast to this, the circuit operation is more stable in the first flip-flop circuit 10. The SRAM type and the clocked inverter type are now compared with each other. Since, in the SRAM type, the active/inactive state is controlled by only the clock signal CLK inputted to the gate terminal of the activation transistor M73, the malfunction is more likely to occur as compared with a case where it is controlled by both the clock signal c and the inverted clock signal cn generated within the flip-flop circuit.

According to the second embodiment as described above, a plurality of flip-flop circuits, having different circuit configurations, which perform the identical function are integrated on a single semiconductor substrate and those flip-flop circuits are used separately for optimal purposes. As a result, a semiconductor integrated circuit stably operating with low power consumption can be realized.

Next, a description is given of a third embodiment The third embodiment differs in the capacitance of the gate of a transistor to which a clock signal and an inverted clock signal are inputted. That is, the size of the first control transistor M63, the second control transistor M64, the third control transistor M67 and the fourth control transistor M68 in the first master-side clocked inverter 62 and the second master-side clocked inverter 66 shown in FIG. 3 and FIG. 4 is designed to be smaller than the size of corresponding control transistors (not shown) in the first master-side clocked inverter 62 and the first slave-side clocked inverter 72 shown in FIG. 2. For example, the channel width of the gate is designed narrower.

In the third example, the second flip-flop circuit 20 shown in FIG. 3 and FIG. 4 is now compared with the first flip-flop circuit 10 shown in FIG. 2. The size of the control transistors in the first master-side clocked inverter 62 and the second master-side clocked inverter 66 contained in the second flip-flop circuit 20 is smaller than that in the first flip-flop circuit 10. Thus, in comparison with the corresponding transistors in the first flip-flop circuit 10, the power consumed by the transition of the clock signal can be reduced. As a result, the power consumed by the entire flip-flop circuitry can be reduced. When the amplitude of the clock signal CLK decreases due to the attenuation in the clock signal path, the transistors are liable to be deficient in performance due to a decreased capacity of transistors because of the reduced size of the transistors. Thereby, the circuit is more likely to suffer from the circuit malfunction or degradation in circuit speed. The degradation in circuit speed is more likely to violate the required specifications.

The same applies to the control transistors contained in the first slave-side clocked inverter 72 and the second slave-side clocked inverter 76 in the configuration shown in FIG. 3 where no SRAM structure is employed.

According to the third embodiment as described above, a plurality of flip-flop circuits, having different circuit configurations, which perform the identical function are integrated on a single semiconductor substrate and those flip-flop circuits are used separately for optimal purposes. As a result, a semiconductor integrated circuit stably operating with low power consumption can be achieved.

The description of the invention given above is based upon illustrative embodiments. These exemplary embodiments are intended to be illustrative only and it will be obvious to those skilled in the art that various modifications to constituting elements and processes could be developed and that such modifications are also within the scope of the present invention.

In the above-described embodiments, a description has been given of an example where two different kinds of flip-flop circuits are combined together on a single semiconductor substrate. However, this should not be considered as limiting and, for example, three or more different kinds of flip-flop circuits may be mixed thereon. According to this modification, the flip-flop circuits can be used separately for optimal purposes in a more sensitive manner.

Although, in the above-described embodiments, an SRAM latch circuit is used for the slave latch circuit 70 in the second flip-flop circuit 20, the master latch circuit 60 may be configured the same way as with the slave latch circuit 70. According to this medication, the power consumed by the second flip-flop circuit 20 can be further reduced.

In the above-described embodiments, as methods for reducing the power consumption, a description has been given of a method where the number of inverter stages in the clock buffer is designed to be one, a method where the slave latch circuit is designed to be of an SRAM type, and a method where the size of transistors to which the clock signal and the inverted clock signal are inputted is made smaller. A design can be made by arbitrarily combining one or more of these methods in order to configure a flip-flop for the reduction of the power consumption. Hence, a wide variety of circuit configurations are made available among flip-flop circuits to realize the reduction in power consumption. A designer may mix a plurality of kinds of flip-flop circuits on a single semiconductor substrate wherein the flip-flop circuits differ in power consumption and stability of the circuit operation.

In the above-described embodiments, as a method for supplying the clock signal to the flip-flop circuits, a description has been given of an example where the clock tree scheme is used for a part of them. However, the method for supplying the clock signal is not limited thereto. Even if a single method is used to supply the clock signal, an arrangement will be within the scope of the present invention as long as a plurality of flip-flop circuits, having different circuit configurations, which perform the identical function are integrated on a single semiconductor substrate.

While the preferred embodiments of the present invention and the modifications to the embodiments have been described using specific terms, such description is for illustrative purposes only, and it is to be understood that changes and variations may be further made without departing from the spirit or scope of the appended claims.

What is claimed is:

1. A semiconductor integrated circuit including a first flip-flop circuit and a second flip-flop circuit, having different circuit configurations, which perform an identical digital signal processing, wherein the first and second flip-flop circuits are mixed on a single semiconductor substrate, and wherein, each of the first and second flip-flop circuits includes a clocked inverter, and wherein the size of a transistor, included in the clocked inverter of the second flip-flop circuit, in which conduction or nonconduction is controlled by a clock signal is set to be smaller than the size of a transistor, included in the inverter of the first flip-flop circuit, in which conduction or nonconduction is controlled by the clock signal.

2. A semiconductor integrated circuit, according to claim 1, including a plurality of the second flip-flop circuits, wherein an external clock signal, supplied externally, with an equal delay time is inputted to each of the plurality of the second flip-flop circuits.

3. A semiconductor integrated circuit according to claim 2, wherein the external clock signal is supplied via a path wired by a clock tree scheme.

* * * * *